(12) United States Patent
Buono

(10) Patent No.: US 11,575,353 B2
(45) Date of Patent: Feb. 7, 2023

(54) OVERPOWER PROTECTION USING A POWER-MIRRORING RESISTOR

(71) Applicant: Crestron Electronics, Inc., Rockleigh, NJ (US)

(72) Inventor: Robert Buono, Mahwah, NJ (US)

(73) Assignee: Crestron Electronics, Inc., Rockleigh, NJ (US)

( * ) Notice: Subject to any disclaimer, the term of this patent is extended or adjusted under 35 U.S.C. 154(b) by 0 days.

(21) Appl. No.: 17/410,384

(22) Filed: Aug. 24, 2021

(65) Prior Publication Data

US 2022/0069781 A1 Mar. 3, 2022

Related U.S. Application Data

(60) Provisional application No. 63/070,200, filed on Aug. 25, 2020.

(51) Int. Cl.
*H03F 3/217* (2006.01)
*H03F 1/32* (2006.01)
*H03F 3/183* (2006.01)

(52) U.S. Cl.
CPC .......... *H03F 3/217* (2013.01); *H03F 1/32* (2013.01); *H03F 3/183* (2013.01); *H03F 2200/03* (2013.01)

(58) Field of Classification Search
CPC . H03F 3/217; H03F 1/32; H03F 3/183; H03F 2200/03; H03F 2200/447; H03F 2200/468; H03F 1/52; H03F 3/68
(Continued)

(56) References Cited

U.S. PATENT DOCUMENTS

| 7,391,258 | B2 * | 6/2008 | Frederiksen | H03F 3/217 330/10 |
| 9,113,257 | B2 * | 8/2015 | Collins | H04R 3/14 |
| 10,778,160 | B2 * | 9/2020 | Butler | H03F 3/2173 |

OTHER PUBLICATIONS

"Understanding PCB Effective Thermal Conductivity" Cadence PCB Solutions, Feb. 5, 2021, https://resources.orcad.com/home/2021-understanding-pcb-effective-thermal-conductlvity.
(Continued)

*Primary Examiner* — Hieu P Nguyen
(74) *Attorney, Agent, or Firm* — Crestron Electronics, Inc.

(57) ABSTRACT

An audio amplifier system is described herein, comprising: an amplifier adapted to amplify an audio signal and comprising an output enable/disable input, the amplifier further adapted to receive an output enable signal at the output enable/disable input that enables/disables an output of the amplifier; a Zobel network connected to the output of the audio amplifier and comprising a Zobel capacitor and a Zobel resistor arranged such that they form a high pass frequency filter function and wherein the Zobel network is adapted to be substantially resistive when a frequency of an audio signal output from the audio amplifier is within a first frequency range; a mirroring resistor connected in parallel to the Zobel resistor and adapted to mirror a power that is dissipated in the Zobel resistor, and wherein a printed circuit board upon which the mirroring resistor is located is adapted to conduct heat generated by the mirroring resistor; a negative temperature coefficient (NTC) resistor located in close proximity to the mirroring resistor to receive the conducted heat from the mirroring resistor and which is adapted to change its resistance in response to the transferred heat such that its resistance goes down as a temperature of the NTC resistor increases; and a circuit adapted to generate the output enable signal, wherein the circuit gen-
(Continued)

erates an output enable signal that enables the output of the amplifier when the temperature of the Zobel resistor is below a first temperature, and wherein the circuit generates an output enable signal that disables the output of the amplifier when the temperature of the Zobel resistor is substantially the same or above the first temperature.

17 Claims, 7 Drawing Sheets

(58) Field of Classification Search
USPC .............................. 330/10, 207 A, 251, 289
See application file for complete search history.

(56) References Cited

OTHER PUBLICATIONS

"PCB Trace Thermal Analysis and Effective Conductivity" ASME, Dec. 1992, vol. 114, p. 413-419.

\* cited by examiner

OVERPOWER PROTECTION USING A POWER-MIRRORING RESISTOR

PRIORITY INFORMATION

The present application claims priority under 35 U.S.C. § 119(e) to U.S. Provisional Patent Application Ser. No. 63/070,200, filed Aug. 25, 2020, the entire contents of which are expressly incorporated herein by reference.

BACKGROUND OF THE INVENTION

Technical Field

The embodiments described herein relate generally to class D audio amplifiers, and more specifically to systems, methods, and modes for protection of a Zobel network power resistor used in class D audio amplifiers to stabilize load effects on the output of the class D amplifier output.

Background Art

In certain types of audio amplifiers, and in particular Class-D switching amplifiers, it is common to use a Zobel network to stabilize the load effects on the amplifier output. FIG. 1 illustrates a typical Zobel network 100 for use in a typical output section of a Class D audio amplifier. In FIG. 1, Zobel network 100 comprises audio amplifier 102 (e.g., Class-D topology), inductor (L)-capacitor (C) demodulation filter (LC demod filter) 104, Zobel network capacitor ($C_Z$) 106, Zobel network resistor ($R_Z$) 108, and amplifier load 110, which is typically a loudspeaker, as shown in FIG. 1.

A Zobel network, in its simplest incarnation (such as that shown in FIG. 1), is a series connection of a resistor and a capacitor. Due to the series connection of these components, a high-pass filter is created, whereby the Zobel network conducts increasing current as the frequency of the audio output signal impressed across it increases. As the frequency increases, the reactance of the capacitor decreases, such that the capacitor contributes a decreasing reactance to the total impedance of the series network. At very high frequencies, the network's impedance is dominated by the resistor, and so the loading on the amplifier output appears to be resistive. Amplifier feedback loop stability is improved with resistive loading as compared to capacitive loading, so the Zobel network, in this manner, improves the stability of the amplifier at high audio frequencies. A consequence of the overall decreasing impedance of this Zobel network is that the current through the network increases with increasing frequency, which means the power dissipation in the Zobel resistor increases with increasing frequency. Depending on the component values chosen, the power dissipation can be extremely high at 20 KHz, which is the highest typical audio frequency produced by audio amplifiers. Since typical musical content does not contain high frequency content at both high amplitude and for an extended period of time, most designers feel justified in using Zobel resistors that have lower steady-state power dissipation ratings, as long as they have robust, short time duration surge power ratings. The problem with this approach, is that the a priori assumption that the high frequency content will not be both high in amplitude and duration can be violated under some abnormal conditions, such as during bench-testing with continuous tones. It would be highly undesirable for the amplifier to sustain damage under these abnormal conditions, and for this reason, it is desirable to protect the amplifier against damage from these conditions.

Accordingly, a need has arisen for systems, methods, and modes for protection of a Zobel network power resistor used in class D audio amplifiers to stabilize load effects on the output of the class D amplifier output.

SUMMARY

It is an object of the embodiments to substantially solve at least the problems and/or disadvantages discussed above, and to provide at least one or more of the advantages described below.

It is therefore a general aspect of the embodiments to provide systems, methods, and modes for protection of a Zobel network power resistor used in class D audio amplifiers to stabilize load effects on the output of the class D amplifier output that will obviate or minimize problems of the type previously described.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Further features and advantages of the aspects of the embodiments, as well as the structure and operation of the various embodiments, are described in detail below with reference to the accompanying drawings. It is noted that the aspects of the embodiments are not limited to the specific embodiments described herein. Such embodiments are presented herein for illustrative purposes only. Additional embodiments will be apparent to persons skilled in the relevant art(s) based on the teachings contained herein.

According to a first aspect of the embodiments, an audio amplifier system is provided, comprising: an amplifier adapted to amplify an audio signal and comprising an output enable/disable input, the amplifier further adapted to receive an output enable signal at the output enable/disable input that enables/disables an output of the amplifier; a Zobel network connected to the output of the audio amplifier and comprising a Zobel capacitor and a Zobel resistor arranged such that they form a high pass frequency filter function and wherein the Zobel network is adapted to be substantially resistive when a frequency of an audio signal output from the audio amplifier is within a first frequency range; a mirroring resistor connected in parallel to the Zobel resistor and adapted to mirror a power that is dissipated in the Zobel resistor, and wherein a printed circuit board upon which the mirroring resistor is located is adapted to conduct heat generated by the mirroring resistor; a negative temperature coefficient (NTC) resistor located in close proximity to the mirroring resistor to receive the conducted heat from the mirroring resistor and which is adapted to change its resistance in response to the transferred heat such that its resistance goes down as a temperature of the NTC resistor increases; and a circuit adapted to generate the output enable signal, wherein the circuit generates an output enable signal that enables the output of the amplifier when the temperature of the Zobel resistor is below a first temperature, and wherein the circuit generates an output enable signal that disables the output of the amplifier when the temperature of the Zobel resistor is substantially the same or above the first temperature.

According to the first aspects of the embodiments, the change in resistance by the NTC resistor that indicates an over-temperature condition for the Zobel network resistor occurs in less than about 5 seconds.

According to the first aspects of the embodiments, the printed circuit board comprises: a first trace of metal that electrically and thermally connects the mirroring resistor and NTC resistor, and is constructed such that its physical characteristics and dimensions provide a conductivity of the first trace of metal that provides for the change in resistance by the NTC resistor that indicates an over-temperature condition for the Zobel network resistor and occurs in less than about 5 seconds.

According to the first aspects of the embodiments, the mirroring resistor comprises: a resistor adapted to thermally conduct heat into a trace in the PCB, wherein the heat generated by, and thermally conducted from the mirroring resistor, is substantially similar proportional to the heat generated by the Zobel network resistor.

According to the first aspects of the embodiments, the Zobel network resistor generates excessive heat when a test signal is input to the audio amplifier system that comprises a frequency range that is between about 15,000 Hz to about 20,000 Hz for about five seconds.

According to a second aspect of the embodiments, an audio amplifier system is provided, comprising: an amplifier adapted to amplify an audio signal and output the same as an amplified audio signal, the amplifier comprising an output enable/disable input, the amplifier further adapted to receive an output enable signal at the output enable/disable input; a Zobel network connected to the output of the audio amplifier and comprising a Zobel capacitor and a Zobel resistor, and wherein the Zobel network is adapted to stabilize load effects on the amplifier output; and an over-temperature protection circuit adapted to provide the output enable signal to the amplifier, and wherein a status of the output enable signal that enables or disables the output of the amplifier is based on a temperature of the Zobel resistor.

According to the second aspects of the embodiments, the over-temperature protection circuit comprises: a mirroring resistor connected in parallel to the Zobel resistor and adapted to mirror a power that is dissipated in the Zobel resistor, and wherein a printed circuit board upon which the mirroring resistor is located is adapted to conduct heat generated by the mirroring resistor; a negative temperature coefficient (NTC) resistor located in close proximity to the mirroring resistor to receive the conducted heat from the mirroring resistor and which is adapted to change its resistance in response to the transferred heat such that its resistance goes down as a temperature of the NTC resistor increases; and a circuit adapted to generate the output enable signal, wherein the circuit generates an output enable signal that enables the output of the amplifier when the temperature of the Zobel resistor is below a first temperature, and wherein the circuit generates an output enable signal that disables the output of the amplifier when the temperature of the Zobel resistor is substantially the same or above the first temperature.

According to the second aspects of the embodiments, the change in resistance by the NTC resistor that indicates an over-temperature condition for the Zobel network resistor occurs in less than about 5 seconds.

According to the second aspects of the embodiments, the printed circuit board comprises: a first trace of metal that electrically and thermally connects the mirroring resistor and NTC resistor, and is constructed such that its physical characteristics and dimensions provide a thermal conductivity of the first trace of metal that provides for the change in resistance by the NTC resistor that indicates an over-temperature condition for the Zobel network resistor occurs in less than about 5 seconds.

According to the second aspects of the embodiments, the mirroring resistor comprises: a resistor adapted to thermally conduct heat into a trace in the PCB, wherein the heated generated by, and thermally conducted from the mirroring resistor, is substantially similar proportional to the heat generated by the Zobel network resistor.

According to the second aspects of the embodiments, the Zobel network resistor generates excessive heat when a test signal is input to the audio amplifier system that comprises a frequency range that is between about 15,000 Hz to about 20,000 Hz for about five seconds.

According to a third aspect of the embodiments, an audio/video distribution system is provided, comprising: an audio/video (A/V) source adapted to provide an audio/video signal; an A/V receiver adapted to receive the A/V signal generated by the A/V source, and split the A/V signal into an audio signal and a video signal, and transmit the audio signal and the video signal either separately or together; a video display driver adapted to receive the video signal and process the same, and transmit the processed video signal; a video display adapted to receive the processed video signal and display the same; a digital signal processor adapted to receive the audio signal from the A/V receiver and process the received audio signal and output the same as a processed audio signal; an audio amplifier, the audio amplifier comprising: an amplifier adapted to amplify an audio signal and output the same as an amplified audio signal, the amplifier comprising an output enable/disable input, the amplifier further adapted to receive an output enable signal at the output enable/disable input; a Zobel network connected to the output of the audio amplifier and comprising a Zobel capacitor and a Zobel resistor, and wherein the Zobel network is adapted to stabilize load effects on the amplifier output; and an over-temperature protection circuit adapted to provide the output enable signal to the amplifier, and wherein a status of the output enable signal that enables or disables the output of the amplifier is based on a temperature of the Zobel resistor; and one or more loudspeakers adapted to receive the amplified audio signal.

According to the third aspects of the embodiments, the over-temperature protection circuit comprises: a mirroring resistor connected in parallel to the Zobel resistor and adapted to mirror a power that is dissipated in the Zobel resistor, and wherein a printed circuit board upon which the mirroring resistor is located is adapted to conduct heat generated by the mirroring resistor; a negative temperature coefficient (NTC) resistor located in close proximity to the mirroring resistor to receive the conducted heat from the mirroring resistor and which is adapted to change its resistance in response to the transferred heat such that its resistance goes down as a temperature of the NTC resistor increases; and a circuit adapted to generate the output enable signal, wherein the circuit generates an output enable signal that enables the output of the amplifier when the temperature of the Zobel resistor is below a first temperature, and wherein the circuit generates an output enable signal that disables the output of the amplifier when the temperature of the Zobel resistor is substantially the same or above the first temperature.

According to the third aspects of the embodiments, the change in resistance by the NTC resistor that indicates an over-temperature condition for the Zobel network resistor occurs in less than about 5 seconds.

According to the third aspects of the embodiments, the printed circuit board comprises: a first trace of metal that electrically and thermally connects the mirroring resistor and NTC resistor, and is constructed such that its physical characteristics and dimensions provide a thermal conductivity of the first trace of metal that provides for the change in resistance by the NTC resistor that indicates an over-temperature condition for the Zobel network resistor occurs in less than about 5 seconds.

According to the third aspects of the embodiments, the mirroring resistor comprises: a resistor adapted to thermally conduct heat into a trace in the PCB, wherein the heated generated by, and thermally conducted from the mirroring resistor, is substantially similar to the heat generated by the Zobel network resistor.

According to the third aspects of the embodiments, the Zobel network resistor generates excessive heat when a test signal is input to the audio amplifier system that comprises a frequency range that is between about 15,000 Hz to about 20,000 Hz for about five seconds.

According to a fourth aspect of the embodiments, an over-temperature protection circuit for use with electronic circuitry is provided, comprising: a heat generating device; a mirroring resistor connected in parallel to the heat generating device and adapted to mirror a power that is dissipated in the heat generated device, and wherein the mirroring resistor is further adapted to conduct heat generated by the mirrored power; a negative temperature coefficient (NTC) resistor located in close proximity to the mirroring resistor to receive the conducted heat from the mirroring resistor and which is adapted to change its resistance in response to the conducted heat such that its resistance goes down as its temperature increases; and a second circuit adapted to generate an enable signal if the resistance of the NTC resistor is above a first predetermined level and the second circuit is adapted to generate a disable signal if the resistance of the NTC resistor is below the first predetermined level.

BRIEF DESCRIPTION OF THE DRAWINGS

The above and other objects and features of the embodiments will become apparent and more readily appreciated from the following description of the embodiments with reference to the following figures. Different aspects of the embodiments are illustrated in reference figures of the drawings. It is intended that the embodiments and figures disclosed herein are to be considered to be illustrative rather than limiting. The components in the drawings are not necessarily drawn to scale, emphasis instead being placed upon clearly illustrating the principles of the aspects of the embodiments. In the drawings, like reference numerals designate corresponding parts throughout the several views.

DETAILED DESCRIPTION

Figure 1:
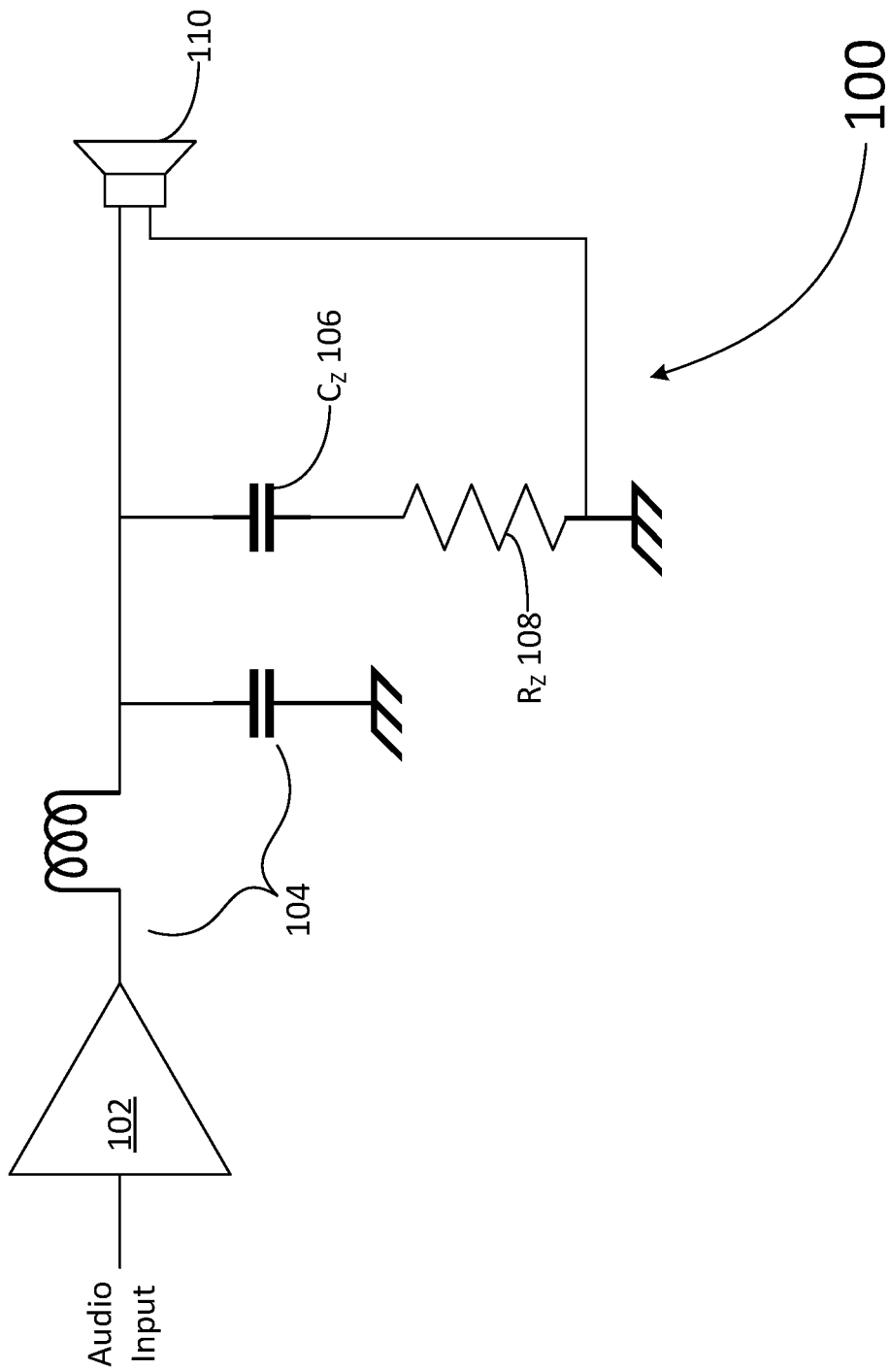
FIG. 1 illustrates a typical Zobel network for use in a typical output section of a Class D audio amplifier.

The embodiments are described more fully hereinafter with reference to the accompanying drawings, in which embodiments of the inventive concept are shown. In the drawings, the size and relative sizes of layers and regions may be exaggerated for clarity. Like numbers refer to like elements throughout. The embodiments may, however, be embodied in many different forms and should not be construed as limited to the embodiments set forth herein. Rather, these embodiments are provided so that this disclosure will be thorough and complete, and will fully convey the scope of the inventive concept to those skilled in the art. The scope of the embodiments is therefore defined by the appended claims. The detailed description that follows is written from the point of view of a company that designs, manufactures, markets, and sells home and business audio-video distribution systems, home and business environmental, lighting, shades, and security systems, and audio-video teleconferencing systems, so it is to be understood that generally the concepts discussed herein are applicable to various subsystems and not limited to only a particular device or class of devices, such as audio amplifiers, and more particularly to audio amplifiers for use with any and all of the above discussed systems.

Reference throughout the specification to "one embodiment" or "an embodiment" means that a particular feature, structure, or characteristic described in connection with an embodiment is included in at least one embodiment of the embodiments. Thus, the appearance of the phrases "in one embodiment" or "in an embodiment" in various places throughout the specification is not necessarily referring to the same embodiment. Further, the particular feature, structures, or characteristics may be combined in any suitable manner in one or more embodiments.

The different aspects of the embodiments described herein pertain to the context of systems, methods, and modes for protection of a Zobel network power resistor used in class D audio amplifiers to stabilize load effects on the output of the class D amplifier output but is not limited thereto, except as may be set forth expressly in the appended claims.

For 40 years Crestron Electronics, Inc., has been the world's leading manufacturer of advanced control and automation systems, innovating technology to simplify and enhance modern lifestyles and businesses. Crestron designs, manufactures, and offers for sale integrated solutions to control audio, video, computer, and environmental systems. In addition, the devices and systems offered by Crestron streamline technology, improving the quality of life in commercial buildings, universities, hotels, hospitals, and homes, among other locations. Accordingly, the systems, methods, and modes for protection of a Zobel network power resistor used in class D audio amplifiers to stabilize load effects on the output of the class D amplifier output, can be used to protect amplifiers, especially Class D amplifiers that can be manufactured by Crestron Electronics Inc., located in Rockleigh, N.J., and has been marketed and sold under the registered trademark name of AMP-4600 and AMP-2800.

LIST OF REFERENCE NUMBERS FOR THE ELEMENTS IN THE DRAWINGS IN NUMERICAL ORDER

The following table is a list of the major elements in the drawings in numerical order.

LIST OF REFERENCE NUMBERS

100 Zobel Network
102 Audio Amplifier
104 L-C demodulation filter 104
106 Zobel Network Capacitor (CZ)
108 Zobel Network Resistor (RZ)
110 Loudspeaker
200 Printed Circuit Board (PCB) Layout
202 Mirroring Resistor (RM)
204 Negative Temperature Coefficient (NTC) Resistor (RNTC)
206 Audio Output Trace
208 Capacitor-Resistor-Resistor (CRR) Trace
210 Ground Trace
212 Thermistor Voltage Trace
300 Zobel Network Power Resistor Protection Circuit (Protection Circuit)
302 Resistor RX
304 Voltage Comparator (Comparator)
700 Audio Video (A/V) Distribution System
702 A/V Source
704 A/V Receiver
706 Video Display Driver
708 Digital Signal Processor (DSP)
710 Display
800 Over-temperature Protection Circuit
802 Heat Generating Device (HGD)
804 PCB Trace

LIST OF ACRONYMS USED IN THE SPECIFICATION IN ALPHABETICAL ORDER

The following is a list of the acronyms used in the specification in alphabetical order.

LIST OF ACRONYMS

Figure 2:
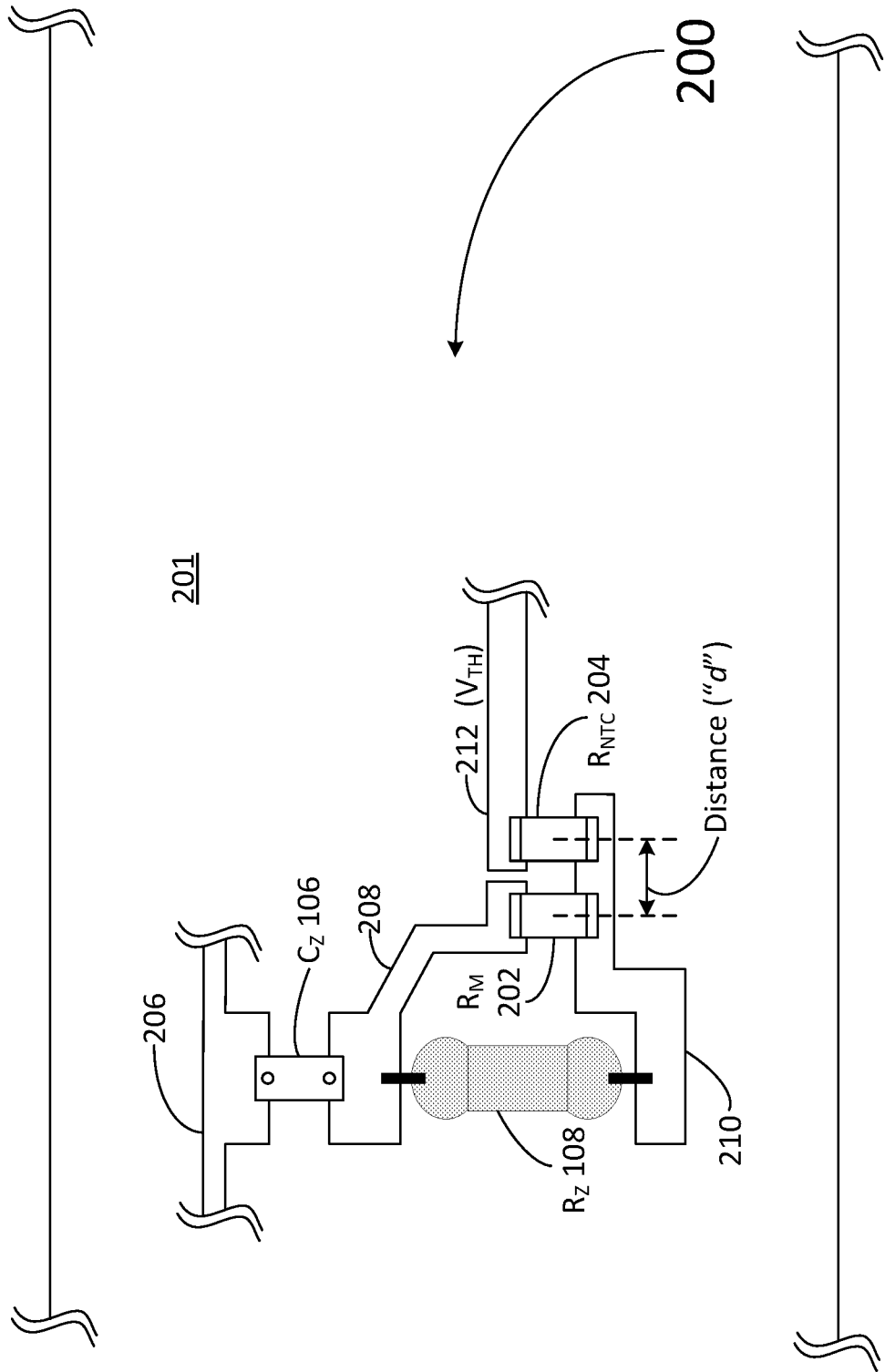
FIG. 2 illustrates a view of a portion of a printed circuit board layout of a Zobel network power resistor protection circuit that protects one or more Zobel network power resistors through use of a negative temperature coefficient (NTC) resistor operating as a thermistor in a power mirroring configuration according to aspects of the embodiments.

A/V Audio Video
C Capacitor
CRR Capacitor-Resistor-Resistor
DSP Digital Signal Processor
L Inductor
NTC Negative Temperature Coefficient
PCB Printed Circuit Board
R Resistor
W Watt FIG. 2 illustrates a view of a portion of a printed circuit board (PCB) layout 200 of a portion of a Zobel network power resistor protection circuit (protection circuit) 300 (shown in greater detail in FIG. 3) that protects one or more Zobel network power resistors $R_x$ 108 through use of a negative temperature coefficient (NTC) resistor in a power mirroring configuration according to aspects of the embodiments. According to aspects of the embodiments, protection circuit 300 can be used on one or more Class D amplifiers that can be manufactured by Crestron Electronics Inc., located in Rockleigh, N.J., and has been marketed and sold under the registered trademark name of AMP-4600 and AMP-2800.

In FIG. 2, PCB layout 200 comprises printed circuit board 201, upon which are located capacitor $C_Z$ 106, high-power resistor $R_Z$ 108, power mirroring resistor ($R_M$) 202 (e.g., a 2512 size surface-mounted package, 2 W, Thick Film Chip resistor), NTC thermistor 204, audio output trace 206, capacitor-resistor-resistor (CRR) trace 208 (which interconnects capacitor $C_Z$ 106, resistor $R_Z$ 108, and resistor $R_M$ 202), ground trace 210, and thermistor voltage trace 212 according to aspects of the embodiments. According to further aspects of the embodiments, resistor $R_Z$ 108 can be a cylindrical wire-wound type resistor, and resistor $R_M$ 202 can be a 2 watt 2512 size surface-mounted package thick-film chip resistor. As those of skill in the art can appreciate, traces are made up of conductive materials, and the current and thermal conductivity of the traces are dependent on the size, shape, and thickness of the conductive materials (e.g., metal(s) that comprises the traces. Further, those of skill in the art can appreciate that the traces are most often made up of copper (Cu).

Aspects of the embodiments are directed towards PCB layout 200 (and the circuit shown in FIG. 3 that includes the components of FIG. 2) that specifically protects the Zobel resistor $R_Z$ 108 from damage due to a sustained overpower condition. Conventional approaches to this problem may utilize a resistor with a package type that can be mounted to a heatsink, and the temperature of the heatsink can be monitored with a thermocouple. The problem with this conventional approach is that this greatly restricts the type of Zobel resistor $R_Z$ 108 that can be used. Power resistors that are designed to be mounted to a heatsink have very specific and limited packaging and physical configurations. These heat sinkable packages, in conjunction with a heatsink, comprise a very large and expensive solution, which is undesirable. In contrast to this aforesaid approach, cylindrical, wire-wound power resistors with axial leads are ubiquitous, and therefore low-cost. Wire-wound power resistors are capable of very high surge power, with time durations in the range of 5 to 10 seconds, which is a time period extremely well suited to expected audio surge intervals. Typical resistors of this type may have a steady-state rating of 10 watts (W), with a surge rating of ten-times this rated power for 5 or 10 seconds. In order to properly protect this type of resistor during a sustained overpower event of ten times its rated power, a protection circuit must be able to limit the duration of this event to less than ten seconds. Aspects of the embodiments are directed towards PCB 200 and the circuit shown in FIG. 3 that implements this type of resistor protection for power resistors of substantially any package type and substantially any type of physical configuration, thereby providing substantially greater flexibility in component selection, and therefore can contribute to size and cost savings for the amplifier design.

Figure 3:
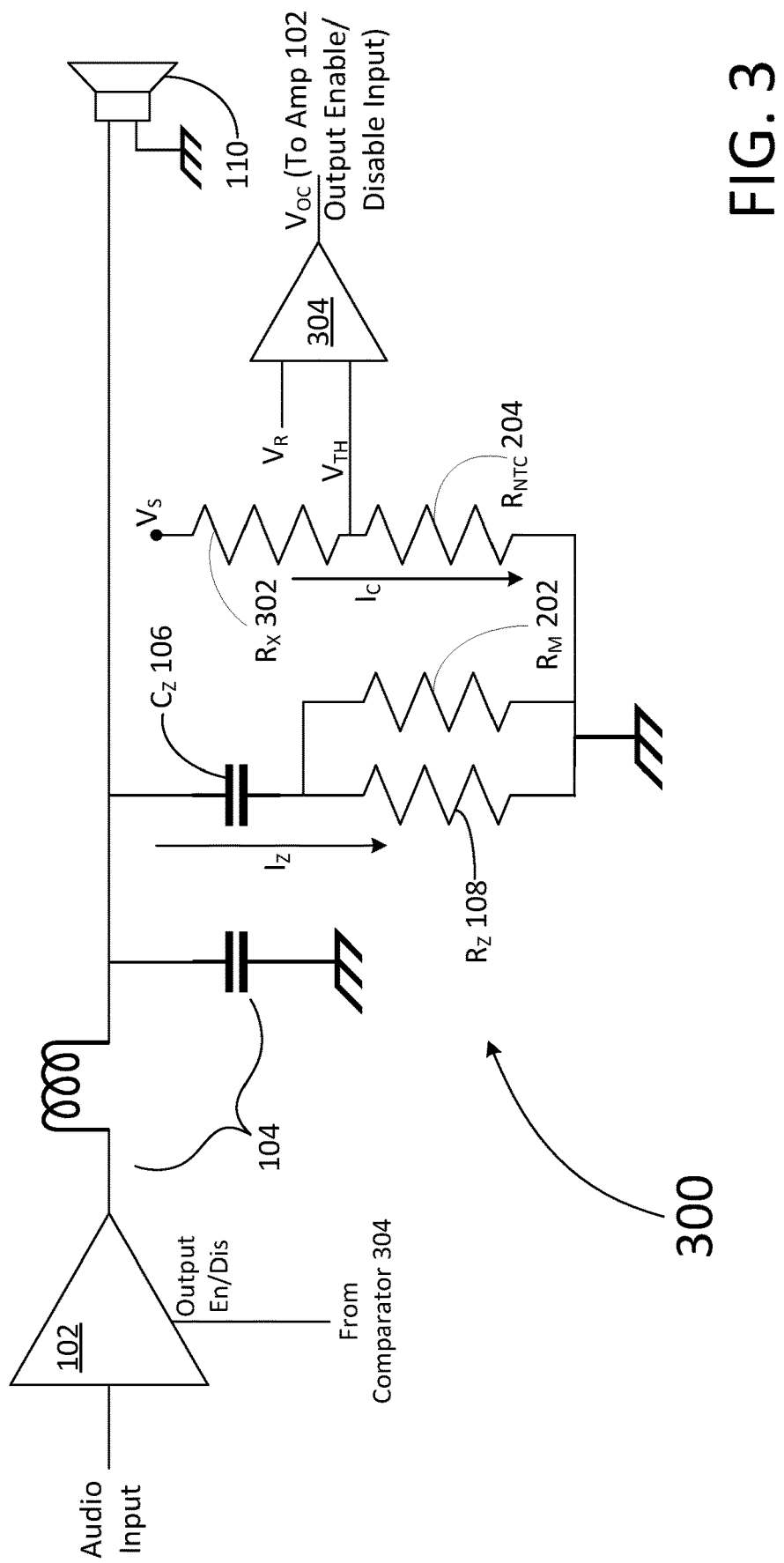
FIG. 3 illustrates a schematic view of a circuit that includes a schematic representation of the printed circuit board layout of FIG. 2 as well as other components of a circuit that protects a Zobel network power resistor through use of a negative temperature coefficient (NTC) resistor in a power mirroring configuration according to aspects of the embodiments.

Attention is directed also to FIG. 3, which illustrates a schematic view of Zobel network power resistor protection circuit (protection circuit) 300 that includes a schematic representation of the PCB layout of FIG. 2 as well as other components of PCB 200 that protects a Zobel network power resistor $R_Z$ 108 through use of a negative temperature coefficient (NTC) resistor in a power mirroring configuration according to aspects of the embodiments.

According to aspects of the embodiments, and as shown in FIGS. 2 and 3, protection circuit 300 uses an additional, low-power resistor as a "power-mirroring" resistor, resistor $R_M$ 202. This additional resistor $R_M$ 202 mirrors the power dissipated in the main Zobel resistor $R_Z$ 108, but is of a physical configuration that makes it well suited to effectively conduct its own heat through the PCB and connecting copper traces—ground trace 210—to a closely coupled thermocouple or thermistor $R_{NTC}$ 204 according to aspects of the embodiments, which is located at a distance d from $R_M$ 202; distance d is minimized to allow for the greatest conduction of heat with minimal loss from $R_M$ 202 to $R_{NTC}$ 204. FIG. 2 illustrates a first view of protection circuit 200 as implemented with through-hole and surface mounted components mounted on a PCB.

According to aspects of the embodiments, the total power dissipated is calculated and the resistor values are picked such that the total power is what the circuit requires (for stability and high-frequency equivalent resistance) and the high power resistor and the mirroring resistor each contribute to the total power dissipated. In this sense, the power dissipated by the mirroring resistor is not wasted power. It is power that would have to have been dissipated by the high power resistor if the mirroring resistor was not there.

Figure 4:
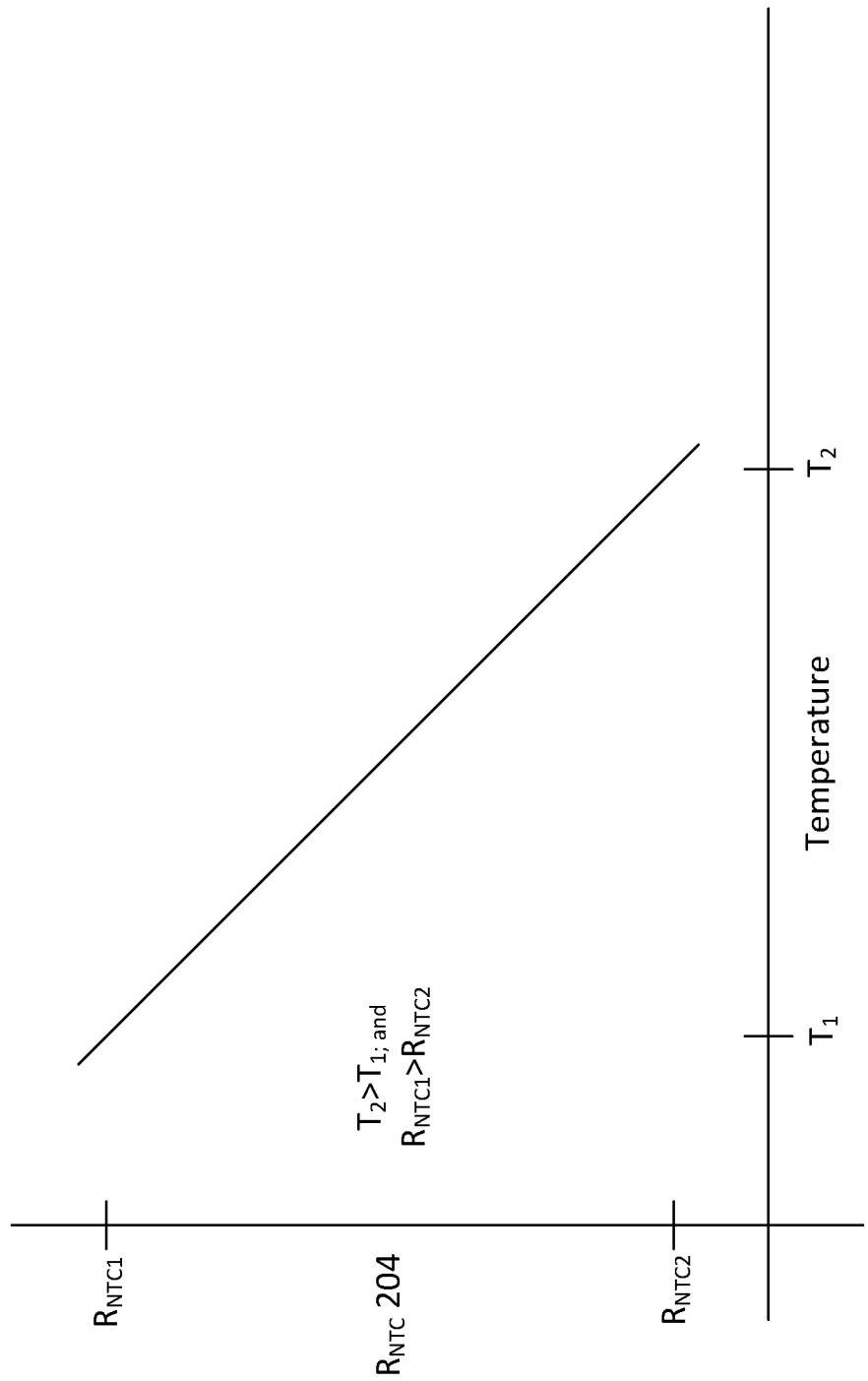
FIG. 4 illustrates a relationship between resistance and temperature of a negative temperature coefficient resistor, operating as a thermistor used in the protection circuit of FIGS. 2 and 3 according to aspects of the embodiments.
Figure 5:
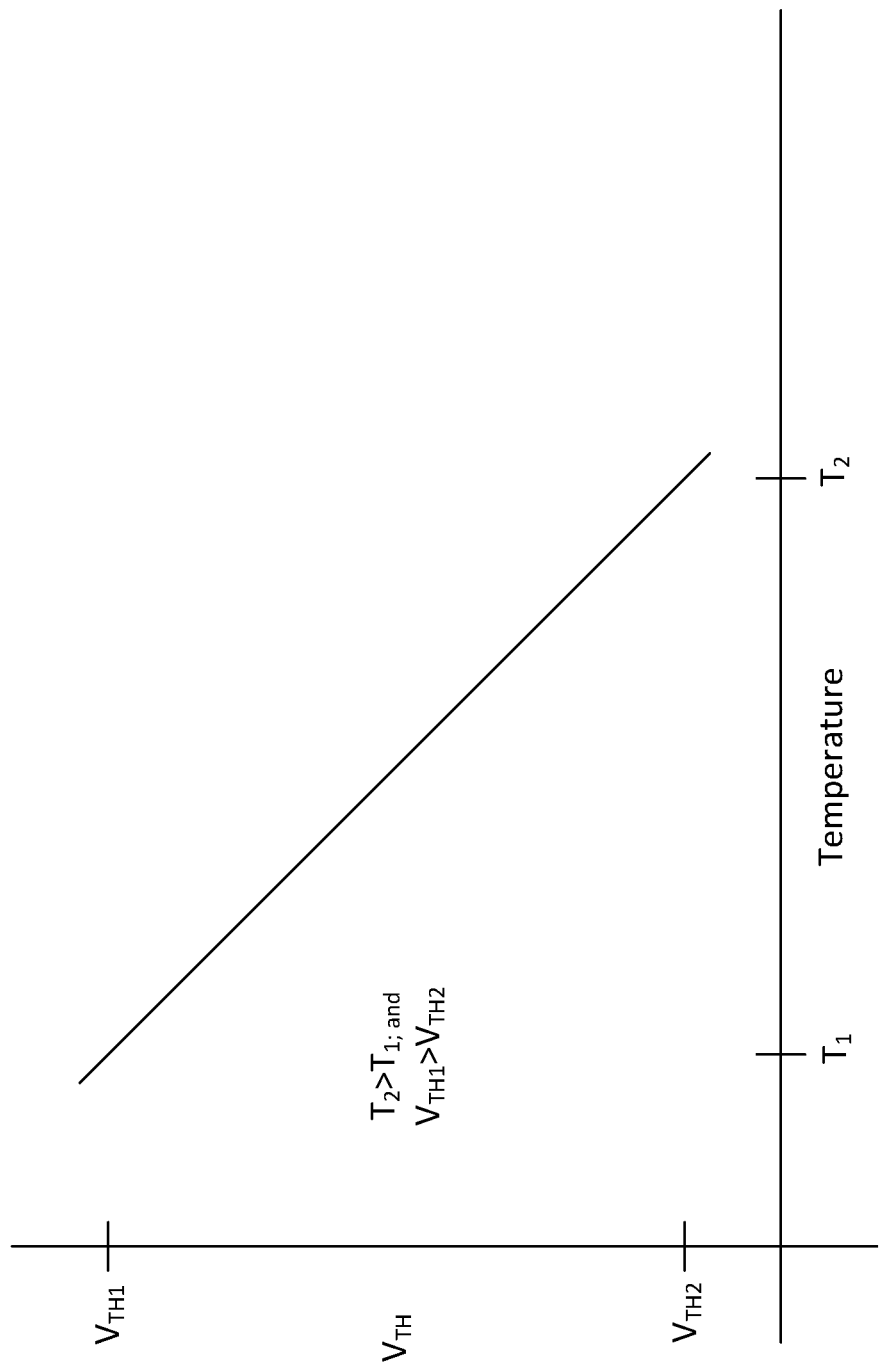
FIG. 5 illustrates a relationship between a voltage across the negative temperature coefficient thermistor (VTH) that is input to a comparator used in the protection circuit of FIGS. 2 and 3 and the negative temperature coefficient thermistor used in the protection circuit of FIGS. 2 and 3 according to aspects of the embodiments.
Figure 6:
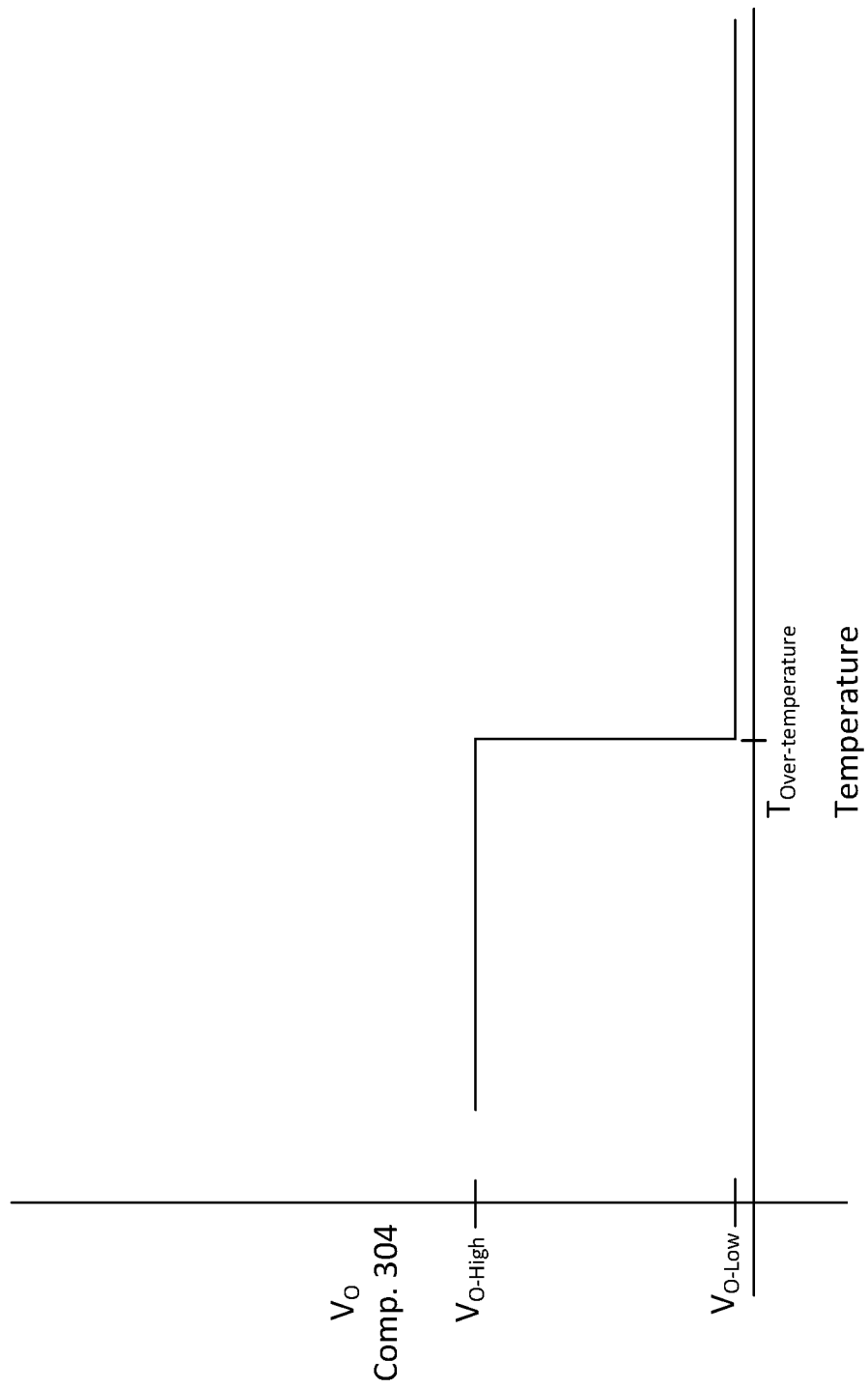
FIG. 6 illustrates a relationship between an output voltage of a comparator used in the protection circuit of FIGS. 2 and 3 and temperature of the negative temperature coefficient resistor used in the protection circuit of FIGS. 2 and 3 according to aspects of the embodiments.

In order to better explain the function of the aspects of the embodiments, non-limiting values will be assigned to the components listed above and as shown in FIGS. 2 and 3, and reference is also made to FIGS. 4-7. FIG. 4 illustrates a relationship between resistance and temperature of a negative temperature coefficient thermistor used in the protection circuit of FIGS. 2 and 3 according to aspects of the embodiments, FIG. 5 illustrates a relationship between a voltage across the negative temperature coefficient thermistor ($V_{TH}$) that is input to a comparator used in the protection circuit of FIGS. 2 and 3 which is the negative temperature coefficient thermistor used in the protection circuit of FIGS. 2 and 3 according to aspects of the embodiments, and FIG. 6 illustrates a relationship between an output voltage of a comparator used in the protection circuit of FIGS. 2 and 3 and temperature of the negative temperature coefficient resistor used in the protection circuit of FIGS. 2 and 3 according to aspects of the embodiments.

It will be understood by those of skill in the art, however, that the component values used in the discussion below are non-limiting but optimized for the particular amplifier design, and at least one of the benefits according to the aspects of the embodiments is that protection circuit 200 allows greater flexibility in the selection of Zobel resistor $R_Z$ 108 while still providing protection for same, in the event of a sustained over-power condition. The following values will be used for the non-limiting purposes of this discussion:

Zobel Network Capacitor $C_Z$ 106=0.47 uF;
Zobel Network Resistor $R_Z$ 108=7.5 ohms, 14 W steady-state (140 W for 5 seconds surge);
Mirroring Resistor $R_M$ 202=220 ohms, 2 W steady-state (5 W for 5 seconds surge); and
Negative Temperature Coefficient (NTC) Resistor $R_{NTC}$ 204=10K ohms at 25° C., 956 ohms at 100° C.

According to aspects of the embodiments, and as shown in FIG. 3, thermistor resistor $R_{NTC}$ 204 forms the bottom resistor of a resistive voltage divider network ($R_x$ 302 and $R_{NTC}$ 204), which creates a voltage referred to as "thermistor voltage" $V_{TH}$, wherein $V_{TH}=(V_S/(R_X+R_{NTC}))\times R_{NTC}$) that is sensed by voltage comparator (comparator) 304 and compared to a reference voltage $V_C$. Referring to FIGS. 4-7, and presuming that when the input voltage to comparator 304 is greater than the reference voltage the output voltage of comparator 304 is a logic level one or "high" signal (and conversely when the input voltage to comparator 304 is less than the reference voltage than output voltage of comparator 304 is a logic level zero or "low" signal)), then the following conditions exist in regard to the protection circuit of FIGS. 2 and 3:

(1) As the temperature of $R_{NTC}$ 204 increases, its resistance will decrease (see, FIG. 4; resistance decreases as temperature increases);

(2) As the temperature of $R_{NTC}$ 204 increases, the voltage from the voltage divider, $V_{TH}$, (sensed by comparator 304), will decrease (see, FIG. 5); and (3) As the temperature of $R_{NTC}$ 204 increases, the output voltage from comparator 304 will switch from a logic level 1 to a logic level 0 when $V_{TH}$ becomes less than the reference voltage, $V_R$ (see, FIG. 6).

When the output of comparator 304 switches, amplifier 102 can then use this signal as a protection signal, and appropriate actions can be taken to protect Zobel resistor $R_Z$ 102 against damage due to over-dissipation. Typically, appropriate actions are to switch off the audio output, or to attenuate the audio output.

In this illustrative example, an Audio Output signal of 82.5 VRMS will produce 850 W into an 8-ohm load. When this same voltage is applied across the Zobel series network, it will produce a voltage of 32.4V across the parallel combination of the 7.5-ohm Zobel resistor $R_Z$ 108 and the 220-ohm mirroring resistor $R_M$ 202. This will produce 140 W of power dissipation in the Zobel resistor $R_Z$ 108 and 4.77 W of power dissipation in mirroring resistor $R_M$ 202. Due to the close proximity of thermistor $R_{NTC}$ 204 to mirroring resistor $R_M$ 202 on the PCB, and the advantageous construction of the 2 W, 2512 sized surface mounted resistor, the 4.77 W of dissipation in the mirroring resistor $R_M$ 202 efficiently conducts heat into the PCB traces through its wide and flat surface mounted terminations, and will raise the temperature of the common copper trace connection (ground potential connection, ground trace 210) to which both the mirroring resistor $R_M$ 202 and the NTC thermistor $R_{NTC}$ 204 are mounted. The proximity distance as well as the trace width and copper thickness of the connecting traces can be adjusted such that the dissipation of the mirroring resistor $R_M$ 202 raises the temperature of the NTC thermistor $R_{NTC}$ 204 to the comparator trip temperature in less than 5 seconds. This will ensure that the Zobel resistor $R_Z$ 108 is protected from damage due to over-dissipation.

Figure 7:
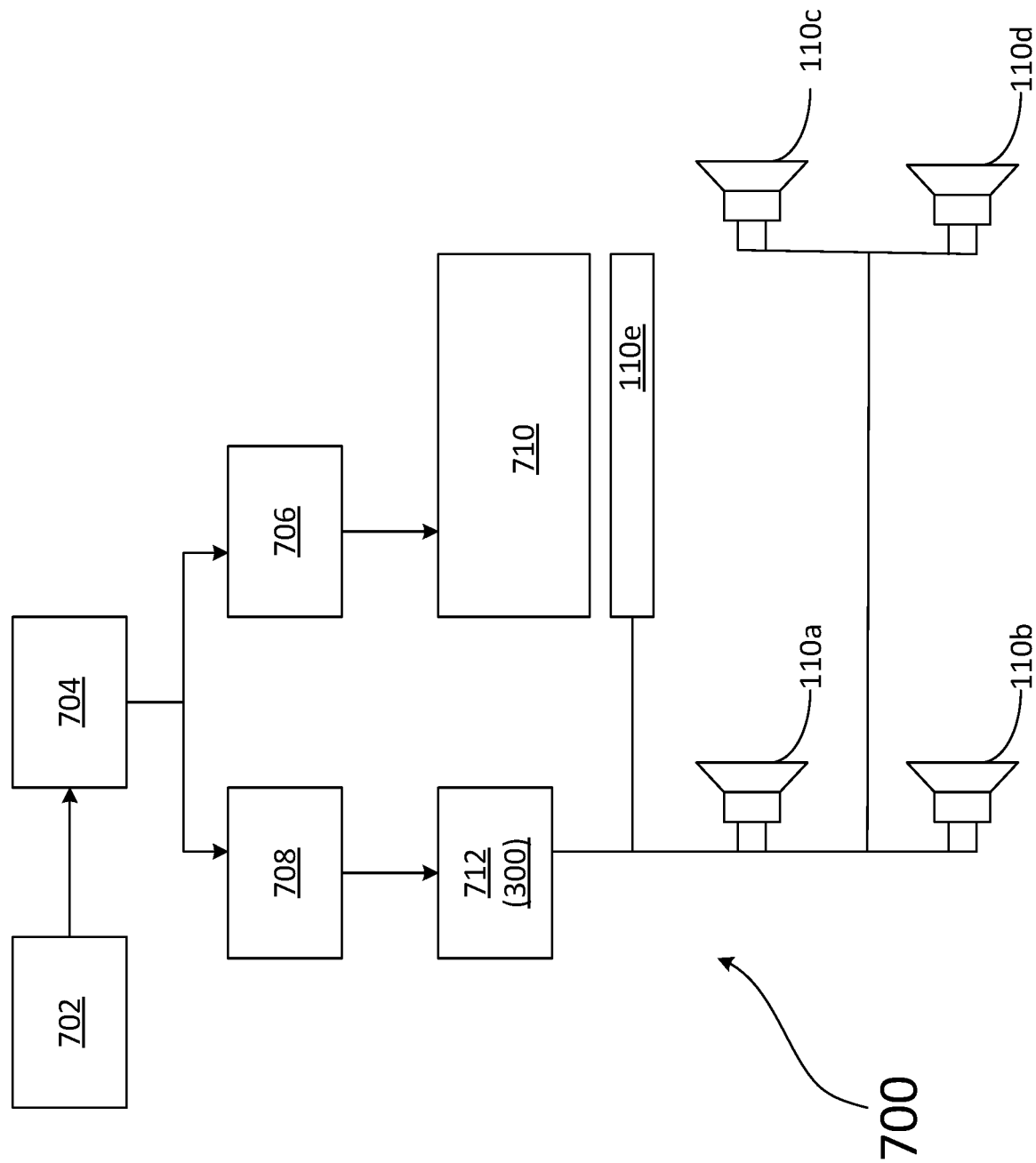
FIG. 7 illustrates a block diagram of an audio-video distribution system within which the Zobel network power resistor protection circuit that protects one or more Zobel network power resistors through use of a negative temperature coefficient (NTC) resistor in a power mirroring configuration can be used according to aspects of the embodiments.

FIG. 7 illustrates a block diagram of an audio-video distribution system (A/V distribution system) 700 within which protection circuit 300 that protects one or more Zobel network power resistors through use of a negative temperature coefficient (NTC) resistor in a power mirroring configuration can be used according to aspects of the embodiments. Such an A/V distribution system 700 can include A/V source 702 (which can be sourced through the internet or some other type of local, wide-area, or global network (e.g., satellite)), A/V receiver 704, digital signal processor (DSP) 708, video display driver 706, display 710, audio amplifier 712 (one or more of which can include protection circuit 300, and which can be Class D amplifiers that can be manufactured by Crestron Electronics Inc., located in Rockleigh, N.J., and has been marketed and sold under the registered trademark name of AMP-4600 and AMP-2800), and speakers 110a-e (one of which can be a soundbar e.g., 110e). Each of components 702, 704, 706, 708, 710, and 712 are or should be known to those of skill in the art, and therefore a detailed explanation of their operation and interaction is not needed and has been omitted for the dual purposes of clarity and brevity. Protection circuit 300 according to aspects of the embodiments has been discussed in greater detail above.

This application may contain material that is subject to copyright, mask work, and/or other intellectual property protection. The respective owners of such intellectual property have no objection to the facsimile reproduction of the disclosure by anyone as it appears in published Patent Office file/records, but otherwise reserve all rights.

The disclosed embodiments provide systems, methods, and modes for protection of a Zobel network power resistor used in class D audio amplifiers to stabilize load effects on the output of the class D amplifier output. It should be understood that this description is not intended to limit the embodiments. On the contrary, the embodiments are intended to cover alternatives, modifications, and equivalents, which are included in the spirit and scope of the embodiments as defined by the appended claims. Further, in the detailed description of the embodiments, numerous specific details are set forth to provide a comprehensive understanding of the claimed embodiments. However, one skilled in the art would understand that various embodiments may be practiced without such specific details.

Although the features and elements of aspects of the embodiments are described being in particular combinations, each feature or element can be used alone, without the other features and elements of the embodiments, or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

The above-described embodiments are intended to be illustrative in all respects, rather than restrictive, of the embodiments. Thus, the embodiments are capable of many variations in detailed implementation that can be derived from the description contained herein by a person skilled in the art. No element, act, or instruction used in the description of the present application should be construed as critical or essential to the embodiments unless explicitly described as such. Also, as used herein, the article "a" is intended to include one or more items.

All United States patents and applications, foreign patents, and publications discussed above are hereby incorporated herein by reference in their entireties.

INDUSTRIAL APPLICABILITY

To solve the aforementioned problems, the aspects of the embodiments are directed towards systems, methods, and modes for protection of a Zobel network power resistor used in class D audio amplifiers to stabilize load effects on the output of the class D amplifier output.

ALTERNATE EMBODIMENTS

Alternate embodiments may be devised without departing from the spirit or the scope of the different aspects of the embodiments.

What is claimed is:

1. An audio amplifier system, comprising:
    an amplifier adapted to amplify an audio signal and comprising an output enable/disable input, the amplifier further adapted to receive an output enable signal at the output enable/disable input that enables/disables an output of the amplifier;
    a Zobel network connected to the output of the audio amplifier and comprising a Zobel capacitor and a Zobel resistor arranged such that they form a high pass frequency filter function and wherein the Zobel network is adapted to be substantially resistive when a frequency of an audio signal output from the audio amplifier is within a first frequency range;
    a mirroring resistor connected in parallel to the Zobel resistor and adapted to mirror a power that is dissipated in the Zobel resistor, and wherein a printed circuit board upon which the mirroring resistor is located is adapted to conduct heat generated by the mirroring resistor;
    a negative temperature coefficient (NTC) resistor located in close proximity to the mirroring resistor to receive the conducted heat from the mirroring resistor and which is adapted to change its resistance in response to the transferred heat such that its resistance goes down as a temperature of the NTC resistor increases; and
    a circuit adapted to generate the output enable signal, wherein
        the circuit generates an output enable signal that enables the output of the amplifier when the temperature of the Zobel resistor is below a first temperature, and wherein
        the circuit generates an output enable signal that disables the output of the amplifier when the temperature of the Zobel resistor is substantially the same or above the first temperature.

2. The audio amplifier system according to claim 1, wherein
    the change in resistance by the NTC resistor that indicates an over-temperature condition for the Zobel network resistor occurs in less than about 5 seconds.

3. The audio amplifier system according to claim 1, wherein the printed circuit board comprises:
    a first trace of metal that electrically and thermally connects the mirroring resistor and NTC resistor, and is constructed such that its physical characteristics and dimensions provide a thermal conductivity of the first trace of metal that provides for the change in resistance by the NTC resistor that indicates an over-temperature condition for the Zobel network resistor and occurs in less than about 5 seconds.

4. The audio amplifier system according to claim 1, wherein the mirroring resistor comprises:
    a resistor adapted to thermally conduct heat into a trace in the PCB, wherein the heat generated by, and thermally conducted from the mirroring resistor, is substantially proportional to the heat generated by the Zobel network resistor.

5. The audio amplifier system according to claim 4, wherein
    the Zobel network resistor generates excessive heat when a test signal is input to the audio amplifier system that comprises a frequency range that is between about 15,000 Hz to about 20,000 Hz for about five seconds.

6. An audio amplifier system, comprising:
    an amplifier adapted to amplify an audio signal and output the same as an amplified audio signal, the amplifier comprising an output enable/disable input, the amplifier further adapted to receive an output enable signal at the output enable/disable input;
a Zobel network connected to the output of the audio amplifier and comprising a Zobel capacitor and a Zobel resistor, and wherein the Zobel network is adapted to stabilize load effects on the amplifier output; and
an over-temperature protection circuit adapted to provide the output enable signal to the amplifier, and wherein a status of the output enable signal that enables or disables the output of the amplifier is based on a temperature of the Zobel resistor.

7. The audio amplifier according to claim 6, wherein the over-temperature protection circuit comprises:
a mirroring resistor connected in parallel to the Zobel resistor and adapted to mirror a power that is dissipated in the Zobel resistor, and wherein a printed circuit board upon which the mirroring resistor is located is adapted to conduct heat generated by the mirroring resistor;
a negative temperature coefficient (NTC) resistor located in close proximity to the mirroring resistor to receive the conducted heat from the mirroring resistor and which is adapted to change its resistance in response to the transferred heat such that its resistance goes down as a temperature of the NTC resistor increases; and
a circuit adapted to generate the output enable signal, wherein
the circuit generates an output enable signal that enables the output of the amplifier when the temperature of the Zobel resistor is below a first temperature, and wherein
the circuit generates an output enable signal that disables the output of the amplifier when the temperature of the Zobel resistor is substantially the same or above the first temperature.

8. The audio amplifier system according to claim 7, wherein
the change in resistance by the NTC resistor that indicates an over-temperature condition for the Zobel network resistor occurs in less than about 5 seconds.

9. The audio amplifier system according to claim 7, wherein the printed circuit board comprises:
a first trace of metal that electrically and thermally connects the mirroring resistor and NTC resistor, and is constructed such that its physical characteristics and dimensions provide a thermal conductivity of the first trace of metal that provides for the change in resistance by the NTC resistor that indicates an over-temperature condition for the Zobel network resistor occurs in less than about 5 seconds.

10. The audio amplifier system according to claim 7, wherein the mirroring resistor comprises:
a resistor adapted to thermally conduct heat into a trace in the PCB, wherein the heated generated by, and thermally conducted from the mirroring resistor, is substantially proportional to the heat generated by the Zobel network resistor.

11. The audio amplifier system according to claim 10, wherein
the Zobel network resistor generates excessive heat when a test signal is input to the audio amplifier system that comprises a frequency range that is between about 15,000 Hz to about 20,000 Hz for about five seconds.

12. An audio/video distribution system comprising:
an audio/video (A/V) source adapted to provide an audio/video signal;
an A/V receiver adapted to receive the A/V signal generated by the A/V source, and split the A/V signal into an audio signal and a video signal, and transmit the audio signal and the video signal either separately or together;
a video display driver adapted to receive the video signal and process the same, and transmit the processed video signal;
a video display adapted to receive the processed video signal and display the same;
a digital signal processor adapted to receive the audio signal from the A/V receiver and process the received audio signal and output the same as a processed audio signal;
an audio amplifier, the audio amplifier comprising:
an amplifier adapted to amplify an audio signal and output the same as an amplified audio signal, the amplifier comprising an output enable/disable input, the amplifier further adapted to receive an output enable signal at the output enable/disable input;
a Zobel network connected to the output of the audio amplifier and comprising a Zobel capacitor and a Zobel resistor, and wherein the Zobel network is adapted to stabilize load effects on the amplifier output; and
an over-temperature protection circuit adapted to provide the output enable signal to the amplifier, and wherein a status of the output enable signal that enables or disables the output of the amplifier is based on a temperature of the Zobel resistor; and
one or more loudspeakers adapted to receive the amplified audio signal.

13. The audio amplifier according to claim 12, wherein the over-temperature protection circuit comprises:
a mirroring resistor connected in parallel to the Zobel resistor and adapted to mirror a power that is dissipated in the Zobel resistor, and wherein a printed circuit board upon which the mirroring resistor is located is adapted to conduct heat generated by the mirroring resistor;
a negative temperature coefficient (NTC) resistor located in close proximity to the mirroring resistor to receive the conducted heat from the mirroring resistor and which is adapted to change its resistance in response to the transferred heat such that its resistance goes down as a temperature of the NTC resistor increases; and
a circuit adapted to generate the output enable signal, wherein
the circuit generates an output enable signal that enables the output of the amplifier when the temperature of the Zobel resistor is below a first temperature, and wherein
the circuit generates an output enable signal that disables the output of the amplifier when the temperature of the Zobel resistor is substantially the same or above the first temperature.

14. The audio amplifier system according to claim 13, wherein
the change in resistance by the NTC resistor that indicates an over-temperature condition for the Zobel network resistor occurs in less than about 5 seconds.

15. The audio amplifier system according to claim 13, wherein the printed circuit board comprises:
a first trace of metal that electrically and thermally connects the mirroring resistor and NTC resistor, and is constructed such that its physical characteristics and dimensions provide a thermal conductivity of the first trace of metal that provides for the change in resistance by the NTC resistor that indicates an over-temperature condition for the Zobel network resistor occurs in less than about 5 seconds.

16. The audio amplifier system according to claim 13, wherein the mirroring resistor comprises:
a resistor adapted to thermally conduct heat into a trace in the PCB, wherein the heat generated by, and thermally conducted from the mirroring resistor, is substantially similar to the heat generated by the Zobel network resistor.

17. The audio amplifier system according to claim 16, wherein
the Zobel network resistor generates excessive heat when a test signal is input to the audio amplifier system that comprises a frequency range that is between about 15,000 Hz to about 20,000 Hz for about five seconds.

* * * * *